United States Patent [19]
Kei Lau et al.

[11] Patent Number: 5,491,304
[45] Date of Patent: Feb. 13, 1996

[54] CONNECTOR FOR INTEGRATED CIRCUIT CHIPS

[75] Inventors: James C. Kei Lau, Torrance; Richard P. Malmgren, Rancho Dominguez; Ronald A. DePace, Mission Viejo, all of Calif.

[73] Assignee: TRW Inc., Redondo Beach, Calif.

[21] Appl. No.: 315,017

[22] Filed: Sep. 29, 1994

Related U.S. Application Data

[62] Division of Ser. No. 10,235, Jan. 28, 1993, Pat. No. 5,376, 226.

[51] Int. Cl.$^6$ ............................................. H05K 1/16
[52] U.S. Cl. .................. 174/264; 174/260; 174/261; 174/262; 361/760; 361/770; 361/790
[58] Field of Search ................................ 174/258, 260, 174/261, 262, 264, 265, 267; 361/760, 770, 784, 785, 790

[56] References Cited

U.S. PATENT DOCUMENTS 5,321,210  6/1994  Kimbara et al. .
5,382,757  1/1995  Ishida .

Primary Examiner—Laura Thomas

[57] ABSTRACT

A connector is disclosed for electrically coupling groups of contact points formed on a first and second electronic circuit chip. The connector is constructed by applying a layer of dielectric material to a planar electrically conductive base, lithographically printing a pattern onto the dielectric material, etching the pattern and creating a plurality of wells extending through the dielectric material and a matching plurality of cavities in the surface of the base, and electroplating the pattern and filling the wells with an electrically conductive electroplate material. The electroplate thereby forms a plurality of conductive members, each extending through the dielectric material. The base is then removed from the dielectric material, thereby forming a connector board having the conductive members extending therethrough for electrically coupling the first and second groups of contact points on the circuit chips.

15 Claims, 4 Drawing Sheets 5,491,304

CONNECTOR FOR INTEGRATED CIRCUIT CHIPS

This is a division of the U.S. patent application Ser. No. 08/010,235, filed Jan. 28, 1993, now U.S. Pat. No. 5,376,226.

BACKGROUND OF THE INVENTION

1. Technical Field

This invention relates generally to a connector for electrically coupling integrated circuit chips, and more particularly to a lithographically manufactured connector for electrically coupling groups of contact points formed on integrated circuit chips.

2. Discussion

The computer industry has, and continues to, expend great effort on miniaturization. Integrated circuit chip technology has resulted in great advances in size reduction. It is desirable to implant the greatest possible number of electronic components on a specific amount of surface area on each integrated circuit chip.

One technique for increasing the number of electronic components in a given of surface area on a integrated circuit board is to stack a number of circuit boards or computer chips to make a three dimensional multichip module. Such a multichip array has been created by the use of a "button board," which is a connector board having through connections or "vias." Button boards have been constructed by forming a series of holes in an electrically insulating board, placing short wires through each of these holes, and physically deforming and crushing the ends of these wires, thereby creating a rivet-shaped electrically conducting connector between a contact point on one side of the button board and another contact point on the opposite side.

In accordance with the race for miniaturization, it is desirable to form three dimensional multichip arrays with very thin integrated circuit chips and connectors, so that more integrated circuit chips may be stacked in a given volume, to enable high density connections of integrated circuit chips. Button board connectors have been constructed having a thickness as small as 10 mil, or 0.010 inches, and having adjacent conductive members being separated by a distance as small as 10 mil, or 0.010 inches. It is therefore desirable to construct a connector for connecting stacked integrated circuit chips in a multichip array which may be formed as thin as possible to increase performance.

SUMMARY OF THE INVENTION

According to a preferred embodiment of the present invention, a connector is disclosed for electrically coupling groups of contact points formed on a first and second electronic integrated circuit chip. The connector is constructed by applying a layer of dielectric material to a planar electrically conductive base, lithographically printing an image of a pattern defining a plurality of pattern elements onto the dielectric material, etching the pattern and creating a plurality of wells extending through the dielectric material and a matching plurality of cavities in the surface of the base, and electroplating the pattern and filling the wells with an electrically conductive electroplate material. The electroplate thereby forms a plurality of conductive members, each extending through the dielectric material. The base is then removed from the dielectric material, thereby forming a connector having conductive members extending therethrough for electrically coupling the first and second groups of contact points on the integrated circuit chips.

The various advantages and features of the present invention will become apparent from the following description and claims in conjunction with the accompanying drawings:

DETAILED DESCRIPTION OF THE PREFERRED EMBODIMENTS

The following description of the preferred embodiments is merely exemplary in nature, and is in no way intended to limit the invention, or its application, or uses.

Figure 1:
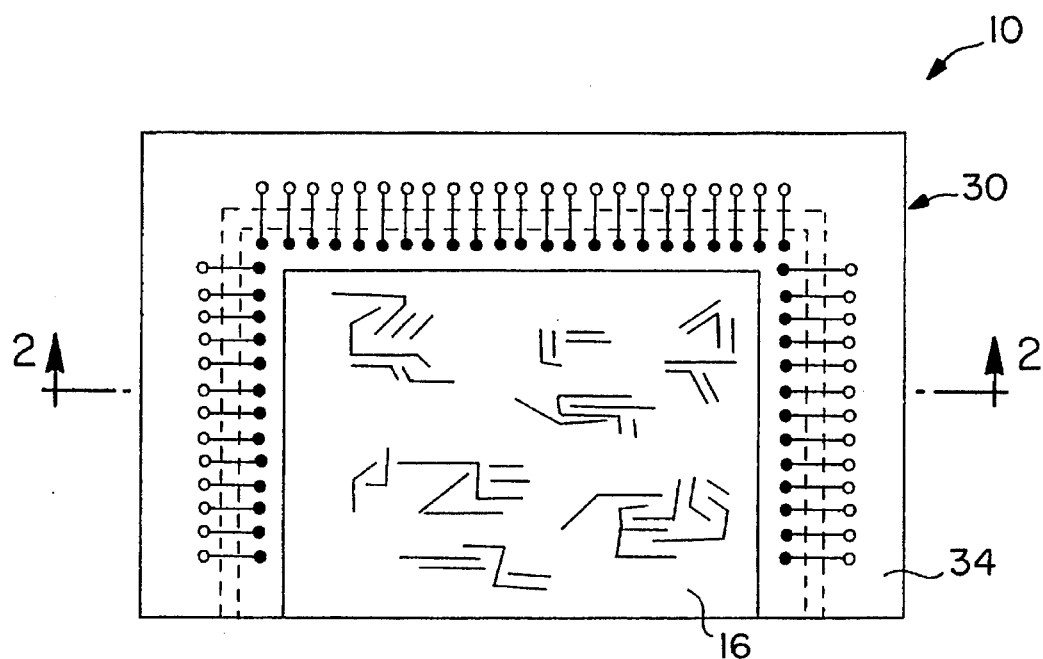
FIG. 1 is a top plan view of the connector of the present invention, assembled in an array with integrated circuit chips.
Figure 2:
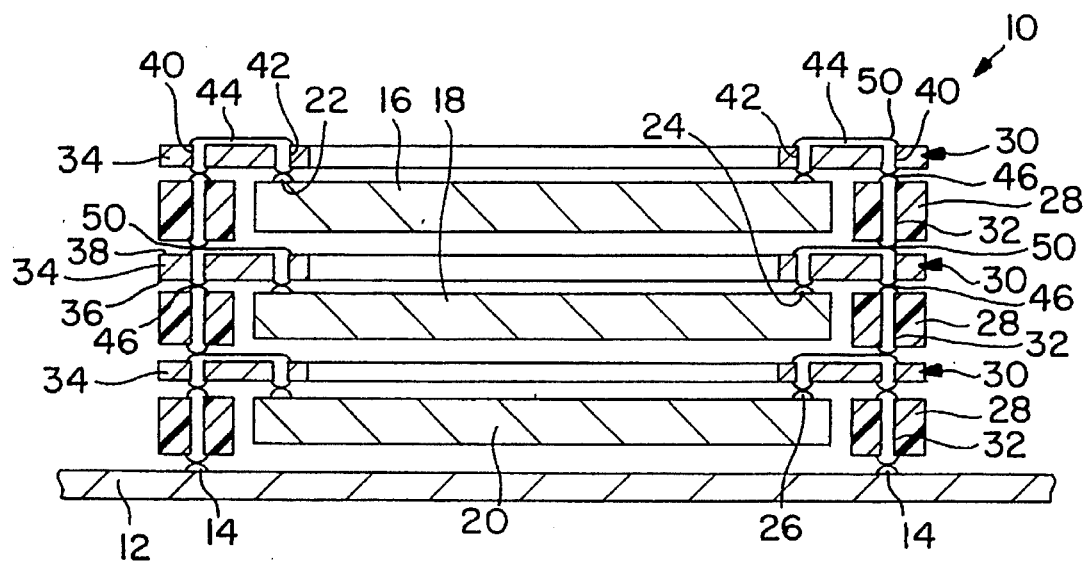
FIG. 2 is a sectional view taken along the line 2—2 in FIG. 1.
Figure 3:
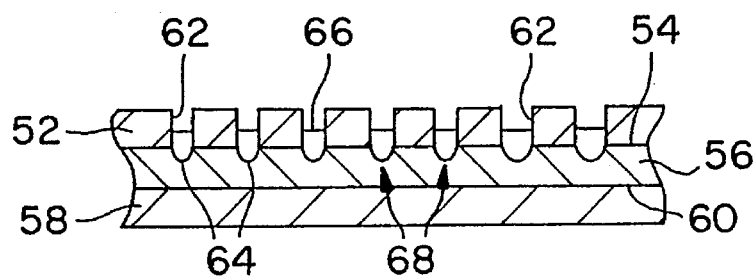
FIGS. 3–6 are a progressive series of views illustrating the method for constructing the connector of the present invention.
Figure 4:
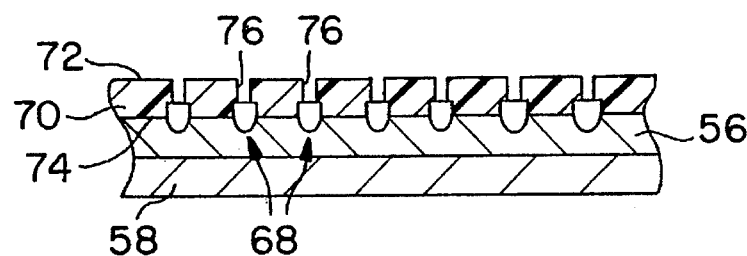
Figure 5:
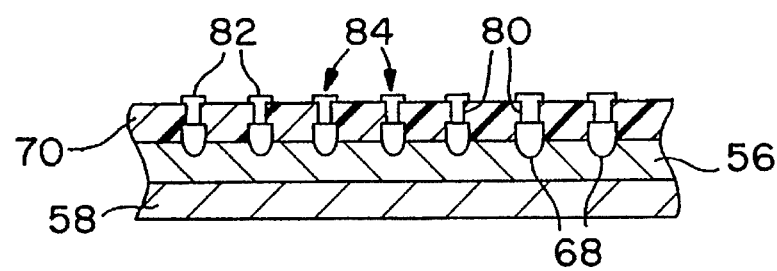
Figure 6:
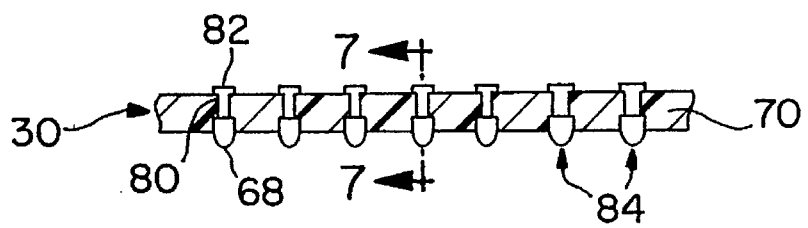
Figure 7:
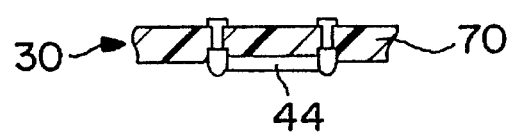
FIG. 7 is a sectional view of the connector of the present invention, taken along line 7—7 in FIG. 6.

With reference to the drawings, a stacked multichip array 10 is shown in FIGS. 1 and 2. Array 10 is formed on a base circuit board or "mother board" 12 having a plurality of base contact points 14 which are electrically coupled with other circuits and electronic components (not shown) formed on mother board 12. A first, second, and third integrated circuit chip, numbered 16, 18 and 20 respectively, are stacked on top of each other in array 10 and have a first, second, and third group of circuit chip contact points, numbered 22, 24, and 26 respectively, which may be electrically coupled with the group of base contact points 14 by a spacer 28 and the novel connector 30 of the present invention. Spacer 28 is generally formed of an electrically insulating dielectric material having a plurality of electrically conductive vias 32 extending therethrough, which may be formed according to the known button board or other filled-via technology.

The connector 30 of the present invention is formed of a connector board 34 formed of a dielectric material and having a first and second side 36 and 38, a first and second group of laterally spaced openings extending through connector board 34, a first and second group of electroplated conductive members 40 and 42 each extending through one of the first and second group of openings respectively, and a third group of conducting members 44 located on the second side 38 of connector board 34, each extending laterally from one of first group of conductive members 40 to one of second group of conductive members 42. The term board is used herein to denote any planar object, regardless of its thickness. The first and second groups of openings are lithographically formed through connector board 34 and are laterally spaced. Each electroplated conductive member in first and second groups 40 and 42 has an anchor portion 46 on the second side 38 of connector board 34. Each anchor 46 has a larger lateral dimension than its respective opening for resisting removal of conducting members 40 and 42. Each of the first and second group of conductive members 40 and 42 further has a via portion 48 extending from anchor 46 through the opening and expanding laterally onto the first side 36 of connector board 34 to form a head portion 50, each head portion 50 also having a lateral dimension larger than the corresponding opening for resisting removal of conducting members 40 and 42. Each of the third group of conducting members extends laterally from an anchor 46 formed on one of first group of conducting members 40 to an anchor 46 formed on one of the second group of conductive members 42. Each head portion 50 formed on the second group of conducting members 42 is arranged to align with and contact a circuit chip contact point 22, 24 or 26, and each head portion 50 formed on the first group of conducting members 40 is arranged to align with and contact a base contact point 14 or a contact point formed on via 32 of spacers 28.

In the embodiment shown in FIGS. 1 and 2, the novel connector 30 of the present invention allows many integrated circuit chips 16, 18 and 20 to be stacked in a single array 10 and provide electrical coupling between groups of contact points formed on integrated circuit chips 16, 18 and 20 and also to another group of contact points 14 formed on base circuit board 12. Connector 30 is formed lithographically and therefore can be made very thin.

One problem with miniaturization of electronic components is the unacceptable buildup of waste heat which must be transferred away from the electronic components. Circuit chips 16, 18, and 20 are generally rectangular, and connectors 30 and spacers 28 may be formed to extend along any number of the peripheral sides of circuit chips 16, 18, and 20. Preferably, connector 30 and spacers 28 are formed to extend along three of the edges of circuit chips 16, 18, and 20, as shown in FIGS. 1 and 2. As a result, the open fourth edges of integrated circuit chips 16, 18 and 20 are left open for heat transfer by forced or natural convection.

Connector 30 is manufactured according to the process of the present invention by applying a layer of photoresist 52 to a first side 54 of a planar electrically conductive base 56 having a layer of insulating material 58 on a second side 60 of base 56. An image of a first pattern is lithographically printed onto photoresist layer 52, thereby defining a plurality of first pattern elements (not shown). The first pattern is then etched, whereby photoresist layer 52 and a portion of base 56 are removed in the locations of the first pattern elements. This etching process thereby creates a plurality of wells 62 extending through photoresist layer 52 and a matching plurality of cavities in first surface 54 of base 56. The first pattern is then electroplated with an electrically conductive electroplate material 66, such that electroplate material 66 fills cavity 64, thereby forming a plurality of anchor portions 68. A variety of materials may be selected for electroplate material 66, such as for example copper, aluminum, silver, or gold. Photoresist layer 52 is then removed from base 56, leaving anchors 68 remaining on base 56. A layer of dielectric material 70 is applied to first side 54 of base 56, such that dielectric 70 covers first side 4 and anchors 68. Dielectric material 70 has a first and second side set, 72 and 74 respectively. An image of a second pattern is lithographically printed onto dielectric material 70, thereby defining a plurality of second pattern elements which are smaller than the first pattern elements. The second pattern is then etched, whereby dielectric material is removed in the locations of the second pattern elements, thereby creating a plurality of openings 76 extending through dielectric material 70 and leading to and exposing anchors 68. Openings 76 are laterally smaller than anchors 68. The second pattern is then electroplated with an electrically conductive electroplate material 78, which may be identical to electroplate 66, such that electroplate 78 fills openings 76 and forms a plurality of via portions 80 each extending from an anchor 68 through one of openings 76 and extending laterally onto the first side of dielectric material 70 to form a head portion 82 having a laterally dimension larger than opening 76. A plurality of conducting members 84 are thereby formed, each extending through dielectric material 70. Base 56 and attached insulating material 58 are removed from dielectric material 70, thereby forming connector 30.

Anchors 68 and head portions 82 resist removal of conducting members 84 from connector board 34 because they are laterally larger than the opening and via portion 80, and they cannot be pulled through the opening. In addition, the step of electroplating the first pattern may be formed such that electroplate material 66 fills cavity 64 and also a portion of wells 62, forming anchor 68 which extends into a recess formed in dielectric material 70, and more firmly affixing conducting member 84 in place in dielectric material 70.

It may be necessary to place a second layer of photoresist material 52 onto first side 72 of dielectric material 70 in order to lithographically print the image of the second pattern, in the event that the dielectric material 70 is not photoreactive.

Further, it may be necessary to deposit a very thin layer of conducting material (not shown) which can be selectively removed without damaging electroplate material 66, such as for example aluminum, onto first side 72 of the dielectric material 70 before placing second layer of photoresist material 52 on top of the thin layer of conducting material (not shown). The next step of etching the second pattern thereby removes the photoresist material 52 and the thin layer of conducting material (not shown), as well as dielectric material 70 in the locations of the second pattern elements. This step of etching thereby creates a plurality of openings extending through photoresist layer 52 and the thin layer of conducting material (not shown) and dielectric material 70. Finally, at the end of the process, the photoresist layer 52 and the thin layer of conducting material (not shown) are removed from dielectric material 70, thereby forming connector 30. Moreover, it may be necessary to perform this etching step by a process of "plasma etching" as known in the art, which is a more powerful process than conventional etching. By forming connector 30 with the novel process of the present invention, connector 30 may be formed having a thickness substantially within the range of 0.5 mil to 5 mil, or 0,005 inches to 0.0005 inches. In addition, each electroplated conductive member 84 of connector 30 may be lithographically formed to be very close to an adjacent electroplated conductive member 84 to enable additional miniaturization. Adjacent conductive members 84 may be separated only by a distance substantially within the range of 1 to 5 mil, or 0.001 to 0.005 inches.

Figure 9:
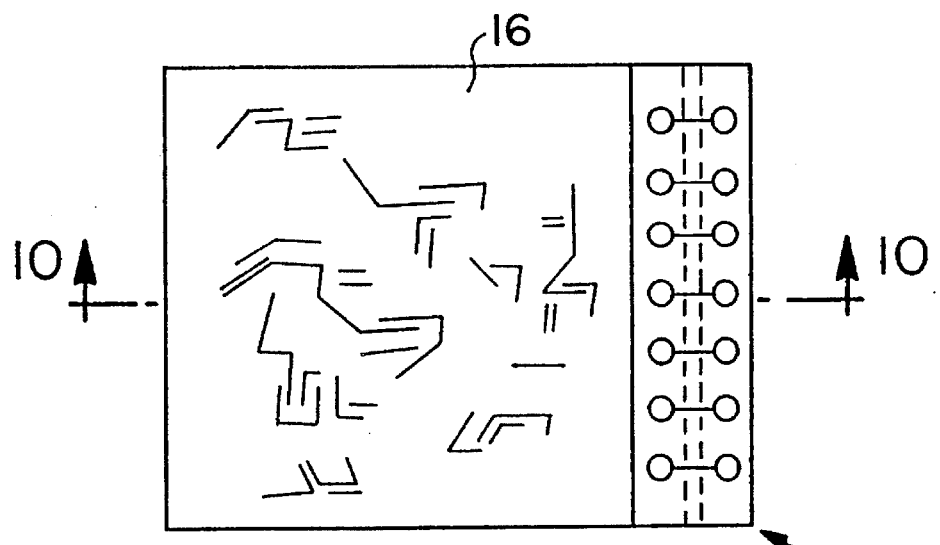
FIG. 9 is a plan view of another alternative embodiment of the present invention.
Figure 10:
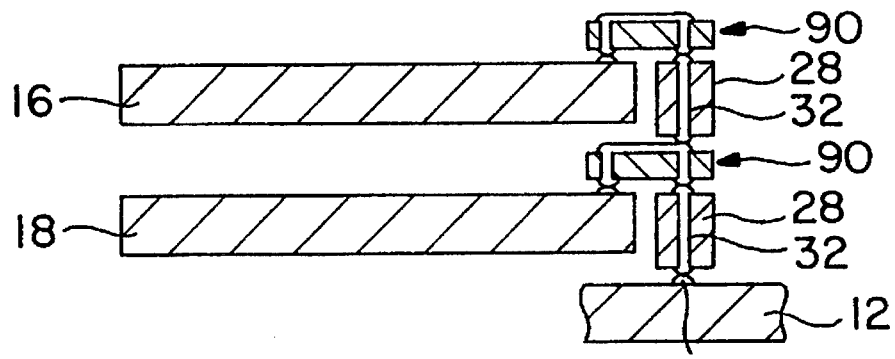
FIG. 10 is a sectional view, taken along line 10—10 in FIG. 9.

An alternative embodiment of the present invention is shown in FIGS. 9 and 10, in which identical reference numerals refer to similar elements. Connector 90 and spacer 28 are formed extending along only one edge of rectangular circuit chips 16 and 18. This construction allows for greater heat transfer away from circuit chips 16 and 18 by either forced or natural convection.

Figure 8:
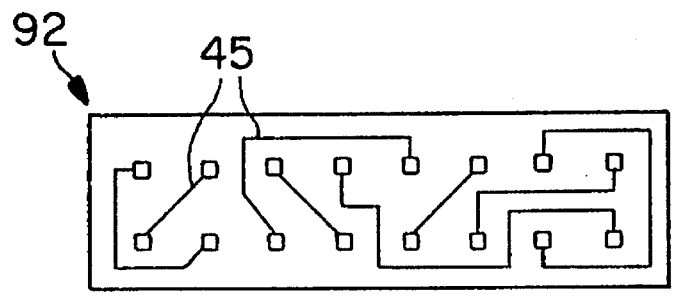
FIG. 8 is a top plan view of a connector arranged according to an alternative embodiment of the present invention.

As shown in FIG. 8, connector 92 may be formed having lateral connections 45 similar to connections 44 which do not simply connect mutually opposing conductive members 40 and 42. In other words, a certain amount of electrical "routing" may be formed directly onto connector 92.

Figure 11:
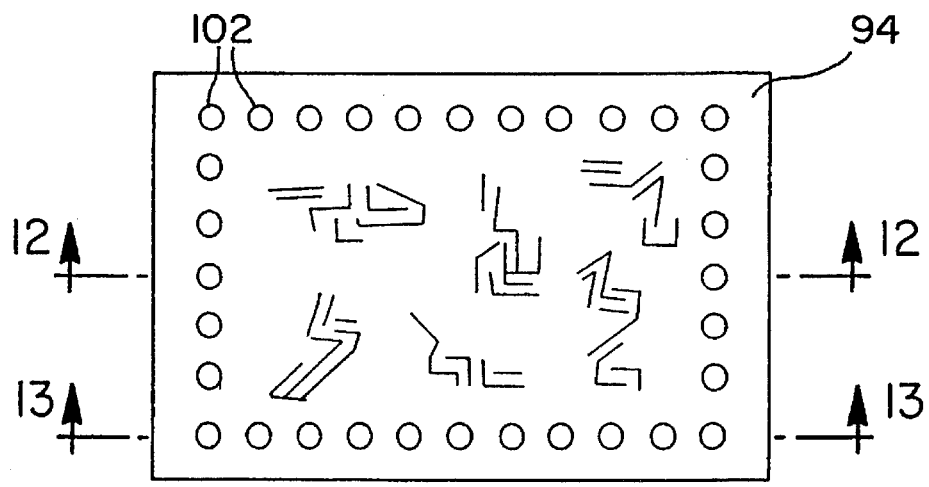
FIG. 11 is a plan view of yet another alternative embodiment of the present invention.
Figure 12:
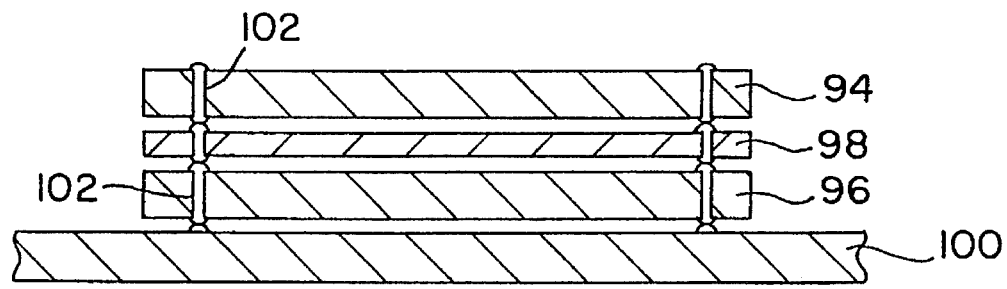
FIGS. 12 and 13 are sectional views, taken along lines 12—12 and 13—13, respectively, in FIG. 11.
Figure 13:
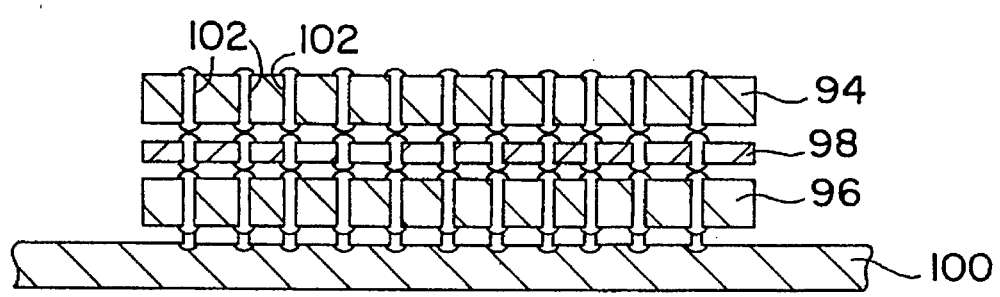

A third alternative embodiment of the present invention is shown in FIGS. 11 through 13, in which no spacer 28 is necessary. In this embodiment, integrated circuit chips 94 and 96 may be connected by connector 98 and also to base or mother board 100, but then circuit chips 94 and 96 must be formed with vias 102 extending therethrough, and the majority of integrated circuit chips are not constructed with such vias 102.

It should be understood that an unlimited number of configurations of the present invention can be realized. The foregoing discussion discloses and describes merely exemplary embodiments of the present invention. One skilled in the art will readily recognize from the discussion and from the accompanying drawings and claims that various changes and modifications can be made without departing from the spirit and scope of the invention, as defined in the following claims.

What is claimed is:

1. A connector for electrically coupling first and second groups of circuit contact points formed on first and second integrated electronic circuit chips respectively, comprising:

a connector board having a first and second side and being formed of a dielectric material, said connector board having a plurality of openings formed therethrough; and a matching plurality of electroplated conductive members each extending through one of said openings and having an anchor portion on said second side of said connector board, said anchor having a larger lateral dimension than the opening, each of said conductive members further having a via portion extending from the anchor through said opening and expanding laterally onto said first side of said connector board to form a head portion having a lateral dimension larger than said opening, said anchors and head portions being arranged to align with and contact said first and second group of circuit contact points formed on said first and second integrated electronic circuit chips, respectively, and to position said first and second integrated electronic circuit chips in a spaced relationship from said connector board to allow heat dissipation.

2. The connector as set fourth in claim 1, wherein said dielectric material has a thickness substantially within the range of 0.0005 to 0.005 inches and wherein each of said electroplated conductive members is separated from an adjacent electroplated conductive member by a distance substantially within the range of 0.001 to 0.005 inches.

3. A connector for electrically coupling first and second groups of circuit contact points formed on first and second integrated electronic circuit chips respectively, comprising:

a connector board having a first and second side and being formed of a dielectric material, said connector board having a first and second group of openings formed therethrough, said first group of openings being laterally spaced from said second group of openings;

a first and second group of electroplated conductive members each extending through one of said openings and each having an anchor portion on said second side of said connector board, each of said anchors having a larger lateral dimension than said one of said openings, each of said conductive members further having a via portion extending from the anchor through the opening and a head portion, connected to said via, which extends laterally onto said first side of said connector board, each head portion having a lateral dimension larger than said opening; and a third group of conducting members located on said second side of said connector board each extending laterally from one of said first group of anchors to one of said second group of anchors, said head portions being arranged to align with and contact said first and second group of circuit contact points formed on said first and second integrated electronic circuit chips, respectively, said head portions and said anchor portions positioning said first and second integrated electronic circuits chips in a spaced relationship from said connector board to allow heat dissipation.

4. The connector as set forth in claim 3, wherein said dielectric material has a thickness substantially within the range of 0.0005 to 0.005 inches.

5. The connector as set forth in claim 3, wherein each of said electroplated conductive members is separated from an adjacent electroplated conductive member by a distance substantially within the range of 0.001 to 0.005 inches.

6. The connector as set forth in claim 3, wherein said first and second circuit chips have a plurality of edges, said groups of contact points being arranged along more than one said edges, said connector serving to electrically couple contact points formed along more than one of said edges.

7. An electronic circuit for maximizing use of circuit board surface area comprising:

a first integrated circuit chip including a first group of contact points on a lower surface thereof for connecting said first chip to said circuit board and a second and third group of contacts on an upper surface thereof;

a second integrated circuit chip including fourth and fifth groups of contact points on a lower surface thereof; and connecting means located between said first and second chips for spacing said first and second chips to allow heat dissipation and for connecting said second group of contact points with said fourth group of contact points and said third group of contact points with said fifth group of contact points, wherein said connecting means includes a connector board formed of a dielectric and having first and second openings extending from an upper surface to a lower surface thereof, first and second conductive members each including an anchor portion adjacent said lower surface, a head portion adjacent said upper surface, and a via portion, located in one of said first and second openings, connecting said anchor portion with said head portion, wherein said anchor portion and said head portion have a lateral dimension larger said first and second openings, and wherein said first and second anchor portions are aligned and in contact with said second and third group of contact points, and said first and second head portions are aligned and in contact with said fourth and fifth group of contact points.

8. The electronic circuit of claim 7 wherein said first integrated circuit chip includes a via connecting said first group of contact points with at least one of said second and third group of contact points.

9. A connector for maximizing use of circuit board surface area by connecting a first group of contact points of a first integrated circuit chip to a second group of contact points of a circuit board comprising:

- a first connector board formed of a dielectric and having a first and second group of openings extending from an upper surface to a lower surface thereof, wherein said first group of openings is laterally spaced from said second group of openings;
- a first and second group of conductive members each including an anchor portion adjacent said upper surface, a head portion adjacent said lower surface, and a via portion connecting said anchor portion with said head portion, said first and second groups of conductive members being located in said first and second groups of openings, said anchor portion and said head portion having a lateral dimension larger said first and second openings; and
- a third group of conducting members connecting said first group of anchors to said second group of anchors.

10. The connector of claim 9 further comprising:

- a third and fourth group of openings in said connector board extending from an upper surface to a lower surface thereof, wherein said third group of openings is laterally spaced from said fourth group of openings, said third and fourth group of openings being spaced from said first and second group of openings;
- a fourth and fifth group of conductive members each including an anchor portion adjacent said upper surface, a head portion adjacent said lower surface, and a via portion connecting said anchor portion with said head portion, said fourth and fifth groups of conductive members being located in said fourth and fifth groups of openings, said anchor portion and said head portion having a lateral dimension larger than said fourth and fifth openings; and
- a sixth group of conductive members connecting said fourth group of anchors to said fifth group of anchors.

11. The connector of claim 9 further comprising:

- a first spacer located adjacent said first chip and between said circuit board and said first connector board, said first spacer being formed of a dielectric and including a fifth group of openings and a seventh group of conducting members, located in said fifth group of openings, each with an anchor portion, a head portion, and a via connecting said anchor portion with said head portion, wherein said head portion and said anchor portion have a larger lateral dimension than said fifth group of openings and wherein said first, second, third and seventh group of conductive members connect said first group of contact points of said circuit board with said second group of contact points of said first chip.

12. A modular electronic circuit for maximizing use of circuit board surface area by connecting multiple chips to first and second groups of contact points of a circuit board, comprising:

- first and second spacers, located adjacent one surface of said circuit board, including a first and second group of conductive members, respectively, said first and second groups of conductive members of said first and second spacers being connected to said first and second groups of contact points, respectively;
- a first connector board, located adjacent said first and second spacers, including a first and second group of U-shaped conducting members, wherein a first end of said first group of U-shaped conducting members projects from one side of said first connector board and is connected to said first group of conductive members of said first spacer, and a first end of said second group of U-shaped conducting members projects from said one side of said first connector board and is connected to said second group of conductive members of said second spacer; and
- a first chip, located between said one side of said first connector board and said circuit board and between said first and second spacers, including a third and fourth group of contact points, said third group of contact points being laterally spaced from said fourth group of contact points,
- wherein a second end of said first and second U-shaped conducting members projects from said one side of said first connector board, is laterally spaced from said first ends and is connected to said third and fourth group of contact points of said first chip, respectively.

13. The modular electronic circuit of claim 12 further comprising:

- third and fourth spacers, located adjacent an opposite side of said first connector, including a third and fourth group of conductive members, respectively, which are connected to middle portions of said first and second U-shaped conductive members, respectively, which are located on said opposite side of said first connector board;
- a second connector board, located adjacent said third and fourth spacers, including a third and fourth group of U-shaped conducting members, wherein a first end of said third group of U-shaped conducting members projects from one side of said second connector board and is connected to said third group of conductive members of said third spacer; and
- a second chip, located between said one side of said second connector board and said opposite side of said first connector board, including a fifth and sixth group of contact points, said fifth group of contact points being laterally spaced from said sixth group of contact points,
- wherein a second end of said third and fourth U-shaped conducting members projects from said one side of said second connector board and is connected to said fifth and sixth group of contact points of said second chip.

14. A modular electronic circuit for maximizing use of circuit board surface area by connecting multiple chips to a first group of contact points on one side of a circuit board, comprising:

- a first spacer, located adjacent said one side of said circuit board, including a first group of conductive members connected to said first group of contact points of said circuit board;
- a first connector, located adjacent said first spacer, including a first group of U-shaped conducting members, wherein a first end of said first group of U-shaped conducting members projects from one side of said first connector and is connected to said first group of conductive members of said first spacer; and
- a first integrated circuit chip, located between said first connector and said circuit board and adjacent said first spacer, including a second group of contact points, wherein a second end of said first U-shaped conducting members projects from said one side of said first connector and is connected to said second group of contact points of said first chip, whereby said first spacer and said first connector electrically connect said first group of contact points of said circuit board to said second group of contact points of said first integrated circuit chip and support said first chip in a spaced relationship relative to said circuit board to allow heat dissipation.

15. The modular electronic circuit of claim 14 further comprising:
- a second spacer, located adjacent said circuit board, including a second group of conductive members connected to a middle portion of said first U-shaped conductive member lying along an opposite surface of said first connector;
- a second connector, located adjacent said second spacer, including a second group of U-shaped conducting members, wherein a first end of said second group of U-shaped conducting members projects from one side of said second connector and is connected to said second group of conductive members of said second spacer; and
- a second chip, located between said second connector and said first connector and adjacent said second spacer, including a third group of contact points wherein a second end of said second U-shaped conducting members projects from said one side of said second connector and is connected to said third group of contact points of said second chip.

* * * * *